US011482857B2

(12) United States Patent
Lin

(10) Patent No.: US 11,482,857 B2
(45) Date of Patent: Oct. 25, 2022

(54) SURGE PROTECTION DEVICE AND CHIP CONSTITUTED BY SAME, AND COMMUNICATION TERMINAL

(71) Applicant: Sheng Lin, Tianjin (CN)

(72) Inventor: Sheng Lin, Tianjin (CN)

(73) Assignee: VANCHIP (TIANJIN) TECHNOLOGY CO., LTD., Tianjin (CN)

( * ) Notice: Subject to any disclaimer, the term of this patent is extended or adjusted under 35 U.S.C. 154(b) by 16 days.

(21) Appl. No.: 17/138,550

(22) Filed: Dec. 30, 2020

(65) Prior Publication Data

US 2021/0119445 A1 Apr. 22, 2021

Related U.S. Application Data

(63) Continuation of application No. PCT/CN2019/093619, filed on Jun. 28, 2019.

(51) Int. Cl.
*H02H 9/02* (2006.01)
*H02H 9/04* (2006.01)

(52) U.S. Cl.
CPC ............ *H02H 9/025* (2013.01); *H02H 9/041* (2013.01); *H02H 9/044* (2013.01)

(58) Field of Classification Search
CPC ........ H02H 9/025; H02H 9/041; H02H 9/044; H01L 27/0266; H01L 27/0292
USPC ....................................................... 361/93.9
See application file for complete search history.

(56) References Cited

U.S. PATENT DOCUMENTS

| 2010/0149705 | A1* | 6/2010 | Son | ................... | H01L 27/0266 257/355 |
| 2010/0213549 | A1* | 8/2010 | Yamamoto | ........ | H01L 29/41758 257/E27.06 |
| 2017/0345814 | A1* | 11/2017 | Wakui | ................. | H01L 29/0847 |
| 2018/0247892 | A1* | 8/2018 | Ikegaya | ............. | H01L 23/5226 |

FOREIGN PATENT DOCUMENTS

JP 07045829 A * 2/1995

* cited by examiner

*Primary Examiner* — Kevin J Comber
(74) *Attorney, Agent, or Firm* — George Guosheng Wang; Upstream Research and Patent LLC

(57) ABSTRACT

Disclosed are a surge protection device and a chip constituted thereby, and a communication terminal. The surge protection device comprises an input pad and an output pad. The input pad is connected to a power supply voltage, and the output pad is connected to a ground wire. NMOS transistor groups are provided between the input pad and the output pad. The NMOS transistor groups are connected to the input pad and the output pad respectively by means of metal wires. The structures of the metal wires between the NMOS transistor groups and the input pad and the output pad respectively and/or the structures of the NMOS transistor groups are changed to reduce or cancel non-uniform turn-on of the NMOS transistor groups caused by metal wires having different lengths from the NMOS transistor groups to the input pad and the output pad respectively along a power supply voltage wire direction.

9 Claims, 5 Drawing Sheets

SURGE PROTECTION DEVICE AND CHIP CONSTITUTED BY SAME, AND COMMUNICATION TERMINAL

BACKGROUND

Technical Field

The present invention relates to a surge protection device, and further relates to a chip including the surge protection device, and a corresponding communication terminal.

Related Art

In an integrated circuit design, a surge is a strong pulse generated at the moment when a power supply is turned on. A chip is highly likely to burn out at the moment when the surge is generated. Therefore, the surge problem needs to be considered first in a chip design. In the prior art, for the chip, the operating principles of multi-level protection and level-by-level reduction are generally used to resolve the surge problem.

As shown in FIG. 1, a multi-level protection circuit generally includes a first-level protection circuit and a power supply clamp circuit inside a protected chip. The first-level protection circuit may use a transient voltage suppressor to absorb a large transient current, and clamp a voltage across both ends of the transient voltage suppressor at a predetermined value, to protect subsequent circuit elements from the impact of a transient high-voltage spike pulse. The power supply clamp circuit is disposed between a power supply voltage and a ground wire, and a plurality of NMOS transistors in the circuit discharge the large transient current, thereby preventing the chip from being burnt out due to the large transient current.

In the power supply clamp circuit, the turn-on uniformity of an NMOS transistor affects the surge protection capability of the NMOS transistor. Therefore, a spacing between a drain and a gate of the NMOS transistor is generally increased to improve the turn-on uniformity. However, this practice may increase a chip area and reduce integration. Alternatively, a silicide protection layer is added to the NMOS transistor to improve the turn-on uniformity of the NMOS transistor, but this practice may significantly increase the costs.

SUMMARY

The main technical problem to be resolved in the present invention is to provide a surge protection device.

Another technical problem to be resolved in the present invention is to provide a chip including the surge protection device and a corresponding communication terminal.

To achieve the foregoing objectives, the following technical solutions are used in the present invention:

According to a first aspect of the embodiments of the present invention, a surge protection device is provided, including an input pad and an output pad, where the input pad is connected to a power supply voltage, the output pad is connected to a ground wire, NMOS transistor groups are disposed between the input pad and the output pad, the NMOS transistor groups are connected to the input pad and the output pad respectively by metal wires, and the structures of the metal wires between the NMOS transistor groups and the input pad and the output pad are changed respectively to reduce or cancel non-uniform turn-on of the NMOS transistor groups caused by different lengths of metal wires from the NMOS transistor groups to the input pad and the output pad respectively in a power supply voltage wire direction.

Preferably, when the NMOS transistor groups are respectively connected to the input pad and the output pad by metal wires having the same width, material, and thickness, quantities of layers of the metal wires from the NMOS transistor groups to the input pad and the output pad are sequentially increased in the power supply voltage wire direction, to sequentially reduce equivalent metal wire resistances from the NMOS transistor groups to the input pad and the output pad respectively.

Preferably, when the NMOS transistor groups are respectively connected to the input pad and the output pad by metal wires having the same quantity of layers, thickness, and material of the metal wires from the NMOS transistor groups to the input pad and the output pad respectively are sequentially increased in the power supply voltage wire direction, to sequentially reduce equivalent metal wire resistances from the NMOS transistor groups to the input pad and the output pad.

Preferably, when the NMOS transistor groups are respectively connected to the input pad and the output pad by metal wires having the same width, material, and quantity of layers, thicknesses of the metal wires from the NMOS transistor groups to the input pad and the output pad respectively are sequentially increased in the power supply voltage wire direction, to sequentially reduce equivalent metal wire resistances from the NMOS transistor groups to the input pad and the output pad respectively.

Preferably, when the NMOS transistor groups are respectively connected to the input pad and the output pad by metal wires having the same width, thickness, and quantity of layers, resistivities of the materials of the metal wires from the NMOS transistor groups to the input pad and the output pad respectively are sequentially reduced in the power supply voltage wire direction, to sequentially reduce equivalent metal wire resistances from the NMOS transistor groups to the input pad and the output pad respectively.

Preferably, when the NMOS transistor groups are respectively connected to the input pad and the output pad by metal wires having the same width, material, thickness, and quantity of layers, the input pad and the output pad are disposed in a middle position of the surge protection device, to reduce the non-uniform turn-on of the NMOS transistor groups caused by different lengths of metal wires from the NMOS transistor groups to the input pad and the output pad respectively in the power supply voltage wire direction.

Preferably, when the NMOS transistor groups are respectively connected to the input pad and the output pad by metal wires having the same width, material, thickness, and quantity of layers, quantities of first connecting holes of adjacent layers of metal wires from the NMOS transistor groups to the input pad and the output pad respectively are sequentially increased in the power supply voltage wire direction, so that each NMOS transistor group has the same sum of an equivalent resistance of connecting holes, an equivalent turn-on resistance, and an equivalent metal wire resistance.

Preferably, in each NMOS transistor group, among NMOS transistors that are connected to metal wires of the input pad and the output pad respectively, adjacent layers of metal wires are connected through the same quantity of first connecting holes, and adjacent layers of metal wires of NMOS transistors in each NMOS transistor group are connected through the same quantity of second connecting holes.

According to a second aspect of the embodiments of the present invention, a surge protection device is provided, including an input pad and an output pad, where the input pad is connected to a power supply voltage, the output pad is connected to a ground wire, NMOS transistor groups are disposed between the input pad and the output pad, the NMOS transistor groups are connected to the input pad and the output pad respectively by metal wires, and the structures of the NMOS transistor groups are changed to cancel non-uniform turn-on of the NMOS transistor groups caused by different lengths of metal wires from the NMOS transistor groups to the input pad and the output pad respectively in a power supply voltage wire direction.

Preferably, when the NMOS transistor groups are respectively connected to the input pad and the output pad by metal wires having the same width, material, thickness, and quantity of layers, widths of NMOS transistors in the NMOS transistor groups are sequentially reduced in the power supply voltage wire direction, so that each NMOS transistor group has the same sum of an equivalent turn-on resistance, an equivalent resistance of connecting holes, and an equivalent metal wire resistance.

Preferably, when the NMOS transistor groups are respectively connected to the input pad and the output pad by metal wires having the same width, material, thickness, and quantity of layers, lengths of NMOS transistor in the NMOS transistor groups are sequentially increased in the power supply voltage wire direction, so that each NMOS transistor group has the same sum of an equivalent turn-on resistance, an equivalent resistance of connecting holes, and an equivalent metal wire resistance.

Preferably, the NMOS transistor groups are connected to metal wires of the input pad and the output pad respectively, the adjacent layers of metal wires are connected through the same quantity of first connecting holes, and the adjacent layers of metal wires of the NMOS transistors in each NMOS transistor group are connected through the same quantity of second connecting holes.

Preferably, when the NMOS transistor groups are respectively connected to the input pad and the output pad by metal wires having the same width, material, thickness, and quantity of layers, quantities of second connecting holes of adjacent layers of metal wires of NMOS transistors in each NMOS transistor group are sequentially increased in the power supply voltage wire direction, so that each NMOS transistor group has the same sum of an equivalent resistance of connecting holes, an equivalent turn-on resistance, and an equivalent metal wire resistance.

Preferably, the NMOS transistor groups are connected to metal wires of the input pad and the output pad respectively, the adjacent layers of metal wires are connected through the same quantity of first connecting holes, and in each NMOS transistor group, adjacent layers of metal wires of each NMOS transistor has the same quantity of second connecting holes.

Preferably, at least one NMOS transistor group formed by the same quantity of NMOS transistors is disposed between the input pad and the output pad, a drain of each NMOS transistor in each NMOS transistor group is connected to the input pad by a metal wire, and a source of each NMOS transistor is connected to the output pad by a metal wire.

According to a third aspect of the embodiments of the present invention, a surge protection device is provided, including an input pad and an output pad, where the input pad is connected to a power supply voltage, the output pad is connected to a ground wire, NMOS transistor groups are disposed between the input pad and the output pad, the NMOS transistor groups are connected to the input pad and the output pad respectively by metal wires, and according to a preset condition, the structures of the metal wires between the NMOS transistor groups and the input pad and the output pad respectively and the structures of the NMOS transistor groups are changed to reduce or cancel non-uniform turn-on of the NMOS transistor groups caused by different lengths of metal wires from the NMOS transistor groups to the input pad and the output pad respectively in a power supply voltage wire direction.

Preferably, widths of NMOS transistors in the NMOS transistor groups are sequentially reduced in the power supply voltage wire direction, so that each NMOS transistor group has the same sum of an equivalent turn-on resistance, an equivalent resistance of connecting holes, and an equivalent metal wire resistance.

Preferably, lengths of NMOS transistor in the NMOS transistor groups are sequentially increased in the power supply voltage wire direction, so that each NMOS transistor group has the same sum of an equivalent turn-on resistance, an equivalent resistance of connecting holes, and an equivalent metal wire resistance.

Preferably, quantities of second connecting holes of adjacent layers of metal wires of NMOS transistors in each NMOS transistor group are sequentially increased in the power supply voltage wire direction, so that each NMOS transistor group has the same sum of an equivalent resistance of connecting holes, an equivalent turn-on resistance, and an equivalent metal wire resistance.

According to a fourth aspect of the embodiments of the present invention, a chip is provided, including the foregoing surge protection device.

According to a fifth aspect of the embodiments of the present invention, a communication terminal is provided, including the foregoing surge protection device.

For the surge protection device provided in the present invention, the structures of the metal wires between the NMOS transistor groups and the input pad and the output pad respectively, and/or the structures of the NMOS transistor groups are changed to reduce or cancel non-uniform turn-on of the NMOS transistor groups caused by different lengths of metal wires from the NMOS transistor groups to the input pad and the output pad respectively in a power supply voltage wire direction, thereby improving the turn-on uniformity of the surge protection device and improving the surge protection capability.

DETAILED DESCRIPTION

The technical content of the present invention is further described below in detail with reference to the accompanying drawings and specific embodiments.

Figure 1:
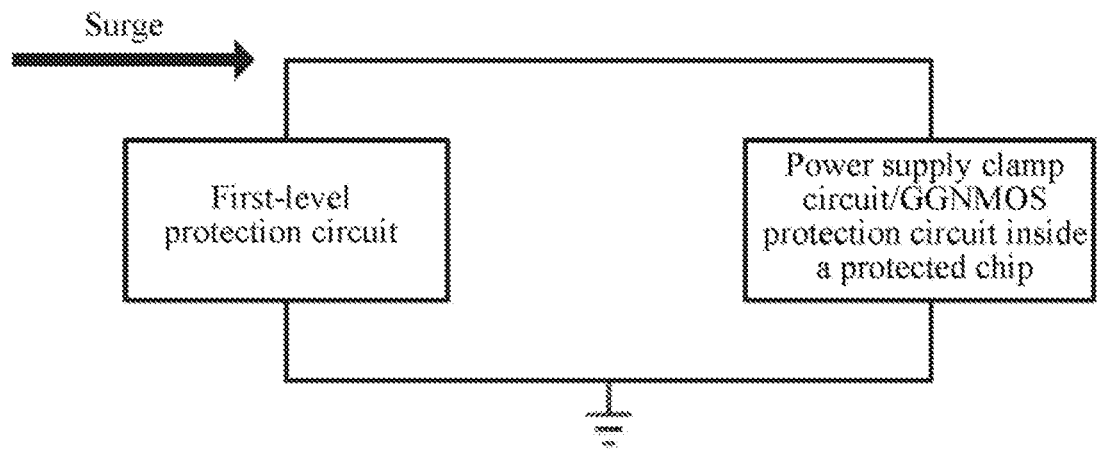
FIG. 1 is a principle diagram of an existing multi-level protection circuit.
Figure 2:
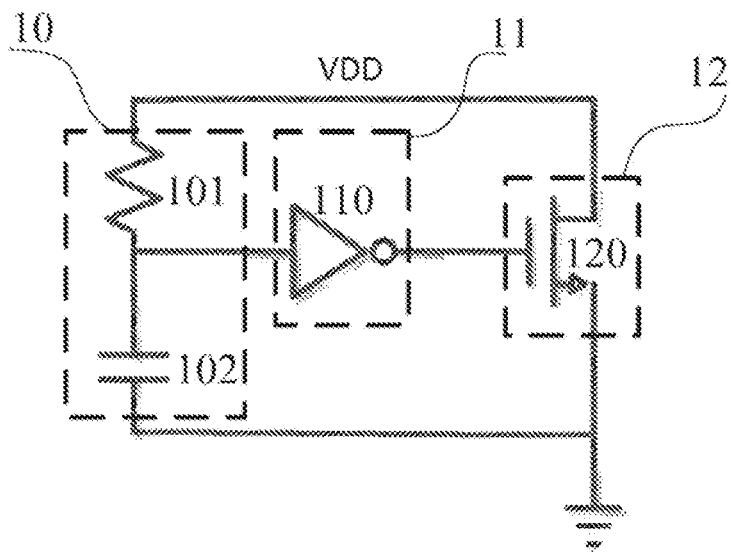
FIG. 2 is a schematic structural diagram of an existing power supply clamp circuit.

As shown in FIG. 2, an existing power supply clamp circuit includes a delay unit 10, a drive unit 11, and a discharge unit 12. The delay unit 10 includes a resistance module 101 and a capacitance module 102. One end of the resistance module 101 is connected to a power supply voltage VDD. The other end of the resistance module 101 is connected to one end of the capacitance module 102 and an input terminal of the drive unit 11 respectively. The other end of the capacitance module 102 is connected to a ground wire. The resistance module 101 includes at least one resistor. When there are a plurality of resistors, the resistors are connected in series with each other. The capacitance module 102 includes at least one capacitor. When there are a plurality of capacitors, the capacitors are connected in parallel with each other. The drive unit 11 is formed by an odd quantity of inverters 110 that are connected in series. In addition, after the odd quantity of inverters 110 are connected in series, an input terminal of the first inverter is used as the input terminal of the drive unit 11, and an output terminal of the last inverter is used as an output terminal of the drive unit 11. Therefore, the input terminal of the drive unit 11 is connected to the other end of the resistance module 101. The output terminal of the drive unit 11 is connected to the discharge unit 12. The discharge unit 12 includes at least one NMOS transistor 120. A gate of the NMOS transistor 120 is connected to the output terminal of the drive unit 11. A drain of the NMOS transistor 120 is connected to the power supply voltage VDD. A source of the NMOS transistor 120 is connected to the ground wire.

When a surge phenomenon occurs, a voltage across both sides of the capacitor in the delay unit 10 does not change suddenly, so that a voltage at a connection point between the capacitor and the resistor in the delay unit 10 is zero. Therefore, the inverter in the drive unit 11 may use a gate voltage of the NMOS transistor in the discharge unit 12 as the power supply voltage, so that the NMOS transistor in the discharge unit 12 is turned on, and a large current during a surge is discharged, to prevent a chip from being burned out due to the large transient current. The NMOS transistor in the discharge unit is a main protection device for surge protection, and the turn-on uniformity of the surge protection device affects the surge protection capability.

For this, the present invention provides a surge protection device that can improve the turn-on uniformity. The surge protection device includes an input pad and an output pad. The input pad is connected to a power supply voltage. The output pad is connected to a ground wire. At least one NMOS transistor group formed by the same quantity of NMOS transistors is disposed between the input pad and the output pad A drain of each NMOS transistor in each NMOS transistor group is connected to the input pad by a metal wire. A source of each NMOS transistor is connected to the output pad by a metal wire.

It should be noted that the NMOS transistor group that is formed by the same quantity of NMOS transistors and is disposed between the input pad and the output pad includes the following cases: 1) There is one NMOS transistor group, and the NMOS transistor group is formed by one NMOS transistor. 2) There are a plurality of NMOS transistor groups, each NMOS transistor group has the same quantity of NMOS transistors, and each NMOS transistor group has one or more NMOS transistors. In addition, in a particular process conditions, various pads such as the input pad and the output pad in the present invention may be alternatively implemented in another manner, for example, a via commonly used in an integrated circuit process. Details are not described herein again.

A specific structure of the surge protection device is described below in detail with reference to FIG. 3 to FIG. 11.

Embodiment 1

Figure 3:
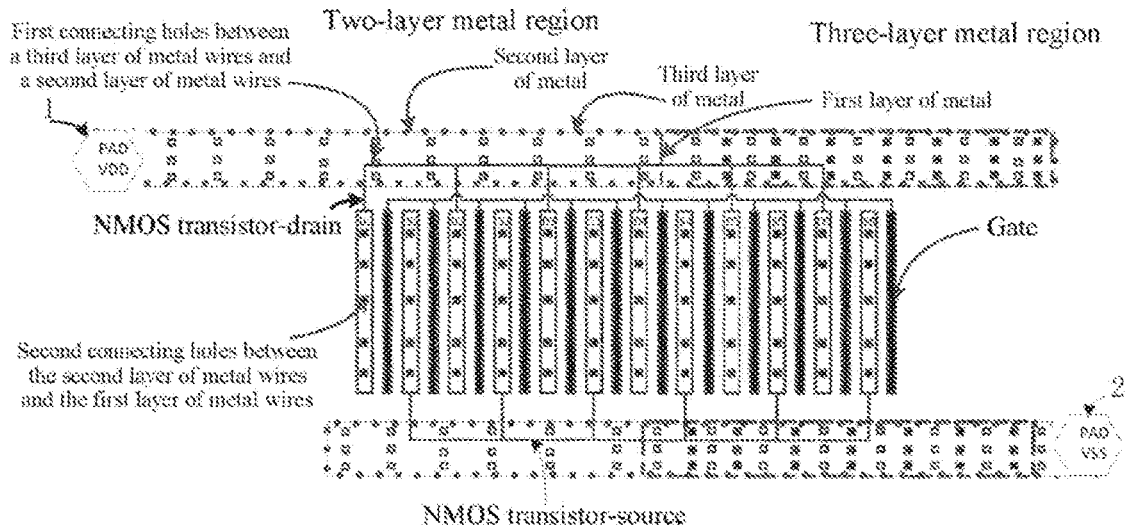
FIG. 3 is a schematic structural diagram of a surge protection device according to Embodiment 1 of the present invention.

As shown in FIG. 3, the surge protection device provided in this embodiment includes an input pad 1 and an output pad 2. The input pad 1 is connected to the power supply voltage VDD. The output pad 2 is connected to a ground wire VSS. At least one NMOS transistor group formed by the same quantity of NMOS transistors is disposed between the input pad 1 and the output pad 2. When there are a plurality of NMOS transistor groups, the plurality of NMOS transistor groups are arranged in parallel. In each NMOS transistor group, drains (for example, drains. $D_1$ to $D_6$ corresponding to NMOS transistors shown in FIG. 3) of the NMOS transistors are connected to the input pad 1 by metal wires, sources (for example, sources $S_1$ to $S_6$ corresponding to the NMOS transistors shown in FIG. 3) of the NMOS transistors are connected to the output pad 2 by metal wires, and gates of the NMOS transistors are connected to the output terminal of the drive unit 11 respectively.

Because distances between the NMOS transistors and the power supply voltage are different, lengths of metal wires from the NMOS transistors to the power supply voltage are also different according to the following formula:

$$R = R_s \frac{L}{W} \quad (1)$$

where, $R_s$ represents a sheet resistance value of each layer of metal wires from each NMOS transistor to the power supply voltage, L represents a length of each layer of metal wires from each NMOS transistor to the power supply voltage, W represents a width of each layer of metal wires from each NMOS transistor to the power supply voltage, and it may be learned that resistances R of metal wires from the NMOS transistors to the power supply voltage are different according to Formula (1).

Therefore, when the NMOS transistor groups in the surge protection device are connected to the input pad 1 and the output pad 2 by metal wires having the same width, material, and thickness, quantities of layers of the metal wires from the NMOS transistor groups to the input pad 1 and the output pad 2 may be sequentially increased in a power supply voltage VDD wire direction, the NMOS transistor groups are connected to metal wires of the input pad and the output pad respectively, the adjacent layers of metal wires are connected through the same quantity of first connecting holes, and the adjacent layers of metal wires of each NMOS transistor in each NMOS transistor group are connected through the same quantity of second connecting holes.

Figure 4:
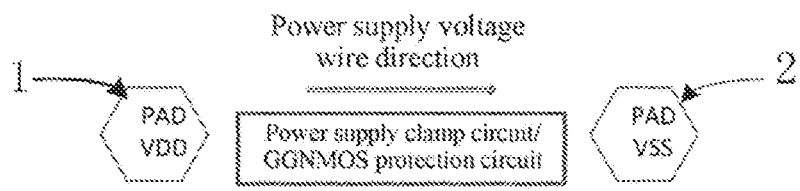
FIG. 4 is a schematic diagram of a power supply voltage wire (a path that a current travels from a pad of a power supply voltage VDD to a power supply clamp circuit or a GGNMOS protection circuit) direction of the power supply clamp circuit or the GGNMOS protection circuit.

For example, as shown in FIG. 3, a first NMOS transistor group, a second NMOS transistor group, and a third NMOS transistor group are disposed between the input pad 1 and the output pad 2. Each NMOS transistor group is formed by two NMOS transistors. The quantities of layers of metal wires from the NMOS transistor groups to the input pad 1 and output pad 2 are sequentially increased in the power supply voltage VDD wire direction (as shown in FIG. 4), so that a quantity of layers of metal wires from NMOS transistors in the first NMOS transistor group to the input pad 1 and the output pad 2 is less than that from NMOS transistors in the second NMOS transistor group to the input pad 1 and output pad 2, and the quantity of layers of metal wires from the NMOS transistors in the second NMOS transistor group to the input pad 1 and the output pad 2 is less than that from NMOS transistors in the third NMOS transistor group to the input pad 1 and the output pad 2. The NMOS transistor groups are connected to the metal wires of the input pad 1 and the output pad 2 respectively, and adjacent layers of metal wires are connected through the same quantity of first connecting holes, so that the layers of metal wires are connected to each other in parallel. Therefore, when there are more layers of metal wires from each NMOS transistor group to the input pad 1 and the output pad 2 respectively, an equivalent metal wire resistance from the NMOS transistor group to the input pad 1 and the output pad 2 is smaller.

Specifically, placement positions of NMOS transistors in each NMOS transistor group are fixed, so that lengths of metal wires from each NMOS transistor group to the input pad 1 and the output pad 2 respectively are fixed, lengths of metal wires from the NMOS transistor groups to the input pad 1 and the output pad 2 are sequentially increased in the power supply voltage VDD wire direction, and in each NMOS transistor group, the equivalent resistance of connecting holes (in each NMOS transistor group, the equivalent resistance of connecting holes is obtained by adding a sum of resistances of first connecting holes of a plurality of adjacent layers of metal wires and a sum of resistances of second connecting holes of each NMOS transistor group) is equal to the equivalent turn-on resistance. Therefore, an equivalent metal wire resistance (a sum of resistances of metal wires from the NMOS transistors in each NMOS transistor group to the input pad 1, or a sum of resistances of metal wires from the NMOS transistors in each NMOS transistor group to the output pad 2) from each NMOS transistor group to the input pad 1 and output pad 2 respectively may be obtained according to Formula 1. An equivalent metal wire resistance from the NMOS transistors in each NMOS transistor group to the input pad 1 is equal to a sum of parallel resistances from the NMOS transistor group to the metal wires of the input pad 1, and an equivalent metal wire resistance from the NMOS transistors in each NMOS transistor group to the output pad 2 is equal to a sum of parallel resistances from the NMOS transistor to metal wires of the output pad 2. Therefore, quantities of layers from the NMOS transistor groups to the metal wires of the input pad 1 and the output pad 2 are sequentially increased in the power supply voltage VDD wire direction, to sequentially reduce equivalent metal wire resistances from NMOS transistor groups to the input pad 1 and the output pad 2, to cancel the non-uniform turn-on of the NMOS transistor groups caused by different resistances of metal wires (resistances of metal wires from the NMOS transistor groups to the input pad 1 and the output pad 2) caused by different lengths of metal wires from the NMOS transistor groups to the input pad 1 and the output pad 2 respectively in the power supply voltage VDD wire direction, thereby improving the turn-on uniformity of the surge protection device and improving the surge protection capability.

The quantities of layers of metal wires from each NMOS transistor group to the input pad 1 and the output pad 2 respectively are determined according to lengths of metal wires from the NMOS transistor group to the input pad 1 and the output pad 2 respectively and equivalent metal wire resistances from an NMOS transistor group in front of the NMOS transistor group to the input pad 1 and the output pad 2 respectively, provided that the equivalent metal wire resistances from the NMOS transistor groups to the input pad 1 and the output pad 2 respectively are sequentially reduced in the power supply voltage VDD wire direction.

Embodiment 2

Figure 5:
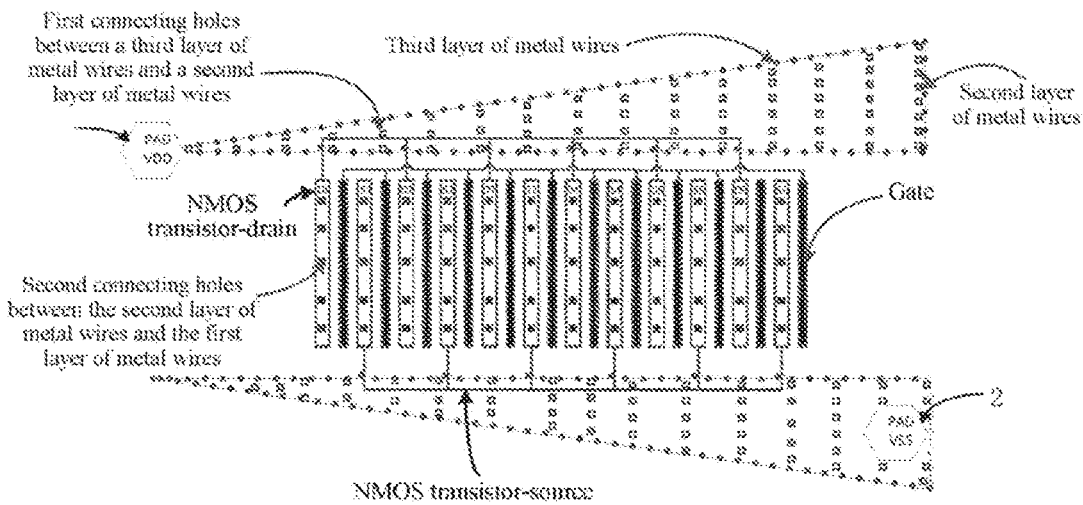
FIG. 5 is a schematic structural diagram of a surge protection device according to Embodiment 2 of the present invention.

As shown in FIG. 5, the surge protection device provided in this embodiment includes an input pad 1 and an output pad 2. The input pad 1 is connected to the power supply voltage VDD The output pad 2 is connected to a ground wire VSS. At least one NMOS transistor group formed by the same quantity of NMOS transistors is disposed between the input pad 1 and the output pad 2. When there are a plurality of NMOS transistor groups, the plurality of NMOS transistor groups are arranged in parallel. In each NMOS transistor group, drains (for example, drains $D_1$ to $D_6$ corresponding to NMOS transistors shown in FIG. 5) of the NMOS transistors are connected to the input pad 1 by metal wires, sources (for example, sources $S_1$ to $S_6$ corresponding to the NMOS transistors shown in FIG. 5) of the NMOS transistors are connected to the output pad 2 by metal wires, and gates of the NMOS transistors are connected to the output terminal of the drive unit 11 respectively.

When the NMOS transistor groups in the surge protection device are connected to the input pad 1 and the output pad 2 by metal wires having the same quantity of layers, thickness, and material of the metal wires from the NMOS transistor groups to the input pad 1 and the output pad 2 respectively may be sequentially increased in a power supply voltage VDD wire direction, the NMOS transistor groups are connected to metal wires of the input pad and the output pad respectively, the adjacent layers of metal wires are connected through the same quantity of first connecting holes, and the adjacent layers of metal wires of each NMOS transistor in each NMOS transistor group are connected through the same quantity of second connecting holes.

For example, as shown in FIG. 5, a first NMOS transistor group, a second NMOS transistor group, and a third NMOS transistor group are disposed between the input pad 1 and the output pad 2. Each NMOS transistor group is formed by two NMOS transistors. Widths of metal wires from the NMOS transistor groups to the input pad 1 and output pad 2 are sequentially increased in the power supply voltage VDD wire direction (as shown in FIG. 4), so that a width of metal wires from NMOS transistors in the first NMOS transistor group to the input pad 1 and the output pad 2 is less than that from NMOS transistors in the second NMOS transistor group to the input pad 1 and output pad 2, and a width of metal wires from the NMOS transistors in the second NMOS transistor group to the input pad 1 and the output pad 2 is less than that from NMOS transistors in the third NMOS transistor group to the input pad 1 and the output pad 2. Because the NMOS transistor groups are respectively connected to the input pad 1 and the output pad 2 by metal wires having the same quantity of layers, thickness, and material, and lengths of metal wires from the NMOS transistor groups to the input pad 1 and the output pad 2 respectively are fixed, when a width of the metal wires from each NMOS transistor group to the input pad 1 and the output pad 2 is larger, equivalent metal wire resistances from the NMOS transistor groups to the input pad 1 and the output pad 2 are smaller.

Specifically, placement positions of NMOS transistors in each NMOS transistor group are fixed, so that lengths of metal wires from each NMOS transistor group to the input pad 1 and the output pad 2 respectively are fixed, lengths of metal wires from the NMOS transistor groups to the input pad 1 and the output pad 2 are sequentially increased in the power supply voltage VDD wire direction, and in each NMOS transistor group, the equivalent resistance of connecting holes is equal to the equivalent turn-on resistance, an equivalent metal wire resistance (a sum of resistances of metal wires from the NMOS transistors in each NMOS transistor group to the input pad 1 or a sum of resistances of metal wires from the NMOS transistors in each NMOS transistor group to the output pad 2) from each NMOS transistor group to the input pad 1 and output pad 2 respectively may be obtained according to Formula 1. Therefore, widths from the NMOS transistor groups to the metal wires of the input pad 1 and the output pad 2 respectively are sequentially increased in the power supply voltage VDD wire direction, to sequentially reduce equivalent metal wire resistances from the NMOS transistor groups to the input pad 1 and the output pad 2 and cancel the non-uniform turn-on of the NMOS transistor groups caused by different resistances of metal wires (equivalent metal wire resistances from the NMOS transistor groups to the input pad 1 and the output pad 2) caused by different lengths of metal wires from the NMOS transistor groups to the input pad 1 and the output pad 2 respectively in the power supply voltage VDD wire direction, thereby improving the turn-on uniformity of the surge protection device and improving the surge protection capability.

The widths of metal wires from each NMOS transistor group to the input pad 1 and the output pad 2 are determined according to lengths of metal wires from the NMOS transistor group to the input pad 1 and the output pad 2 respectively and equivalent metal wire resistances from an NMOS transistor group in front of the NMOS transistor group to the input pad 1 and the output pad 2, provided that the equivalent metal wire resistances from the NMOS transistor groups to the input pad 1 and the output pad 2 respectively are sequentially reduced in the power supply voltage VDD wire direction.

Embodiment 3

The surge protection device provided in this embodiment includes an input pad and an output pad (not shown). The input pad is connected to the power supply voltage VDD. The output pad is connected to a ground wire. At least one NMOS transistor group formed by the same quantity of NMOS transistors is disposed between the input pad and the output pad. When there are a plurality of NMOS transistor groups, the plurality of NMOS transistor groups are arranged in parallel. In each NMOS transistor group, drains of the NMOS transistors are connected to the input pad by metal wires, sources of the NMOS transistors are connected to the output pad by metal wires, and gates of the NMOS transistors are connected to the output terminal of the drive unit 11 respectively.

When the NMOS transistor groups in the surge protection device are connected to the input pad and the output pad by metal wires having the same width, material, and quantity of layers, thicknesses of the metal wires from the NMOS transistor groups to the input pad and the output pad respectively may be sequentially increased in a power supply voltage VDD wire direction, the NMOS transistor groups are connected to metal wires of the input pad and the output pad respectively, the adjacent layers of metal wires are connected through the same quantity of first connecting holes, and the adjacent layers of metal wires of each NMOS transistor in each NMOS transistor group are connected through the same quantity of second connecting holes.

Specifically, placement positions of NMOS transistors in each NMOS transistor group are fixed, so that lengths of metal wires from each NMOS transistor group to the input pad and the output pad respectively are fixed, and the lengths of metal wires from the NMOS transistor groups to the input pad and the output pad respectively are sequentially increased in the power supply voltage VDD wire direction, in each NMOS transistor group, the equivalent resistance of connecting holes is equal to the equivalent turn-on resistance, and in the metal wires used in the NMOS transistor groups, the metal wires may have different thicknesses in different processes Therefore, it may be learned according to the following formula that when the metal wires used in the NMOS transistor groups are made of the same material, when a metal wire is thicker, the metal wire has a higher sheet resistance $$R_s = \rho \frac{L}{S} \qquad (2)$$

$$S = B \times H \qquad (3)$$

where, $R_s$ represents a sheet resistance value of each layer of metal wires from each NMOS transistor to the power supply voltage, p represents the resistivity of the material of the metal wires, L represents a length of each layer of metal wires, S represents a cross-sectional area of each layer of metal wires, B represents a width of each layer of metal wires, and H represents a thickness of each layer of metal wires.

The sheet resistances of the metal wires of each NMOS transistor group obtained according to Formula (2) and Formula (3) are substituted into Formula (1) respectively, an equivalent metal wire resistance (a sum of resistances of metal wires from the NMOS transistors in each NMOS transistor group to the input pad or a sum of resistances of metal wires from the NMOS transistors in each NMOS transistor group to the output pad) from each NMOS transistor group to the input pad and output pad respectively may be obtained Therefore, thicknesses of the metal wires from the NMOS transistor groups to the input pad and the output pad respectively are sequentially increased in the power supply voltage VDD wire direction, to sequentially reduce equivalent metal wire resistances from NMOS transistor groups to the input pad and the output pad, to cancel the non-uniform turn-on of the NMOS transistor groups caused by different resistances of metal wires (equivalent metal wire resistances from the NMOS transistor groups to the input pad and the output pad) caused by different lengths of metal wires from the NMOS transistor groups to the input pad and the output pad respectively in the power supply voltage VDD wire direction, thereby improving the turn-on uniformity of the surge protection device and improving the surge protection capability.

The thicknesses of the metal wires from each NMOS transistor group to the input pad and the output pad respectively are determined according to lengths of metal wires from the NMOS transistor group to the input pad and the output pad respectively and equivalent metal wire resistances from an NMOS transistor group in front of the NMOS transistor group to the input pad and the output pad, provided that the equivalent metal wire resistances from the NMOS transistor groups to the input pad and the output pad respectively are sequentially reduced in the power supply voltage VDD wire direction.

Embodiment 4

The surge protection device provided in this embodiment includes an input pad and an output pad (not shown). The input pad is connected to the power supply voltage VDD. The output pad is connected to a ground wire. At least one NMOS transistor group formed by the same quantity of NMOS transistors is disposed between the input pad and the output pad. When there are a plurality of NMOS transistor groups, the plurality of NMOS transistor groups are arranged in parallel. In each NMOS transistor group, drains of the NMOS transistors are connected to the input pad by metal wires, sources of the NMOS transistors are connected to the output pad by metal wires, and gates of the NMOS transistors are connected to the output terminal of the drive unit 11 respectively.

When the NMOS transistor groups in the surge protection device are connected to the input pad and the output pad by metal wires having the same width, thickness, and quantity of layers, materials of the metal wires from the NMOS transistor groups to the input pad and the output pad respectively may be sequentially changed in a power supply voltage VDD wire direction, to sequentially reduce resistivities of the materials of the metal wires from the NMOS transistor groups to the input pad and the output pad respectively in a power supply voltage VDD wire direction. The NMOS transistor groups are connected to metal wires of the input pad and the output pad respectively, the adjacent layers of metal wires are connected through the same quantity of first connecting holes, and the adjacent layers of metal wires of each NMOS transistor in each NMOS transistor group are connected through the same quantity of second connecting holes.

Specifically, placement positions of NMOS transistors in each NMOS transistor group are fixed, so that lengths of metal wires from each NMOS transistor group to the input pad and the output pad respectively are fixed, and the lengths of metal wires from the NMOS transistor groups to the input pad and the output pad respectively are sequentially increased in the power supply voltage VDD wire direction, in each NMOS transistor group, the equivalent resistance of connecting holes is equal to the equivalent turn-on resistance, and in the metal wires used in the NMOS transistor groups, the metal wires may use different materials in different processes, that is, resistivities of the materials of the metal wires are different. Therefore, it may be learned according to Formula (2) that when the metal wires used in the NMOS transistor groups have the same cross-sectional area, when the material of a metal wire has a smaller resistivity, the metal wire has a lower sheet resistance.

The sheet resistances of the metal wires of each NMOS transistor group obtained according to Formula (2) are substituted into Formula (1) respectively, an equivalent metal wire resistance (a sum of resistances of metal wires from the NMOS transistors in each NMOS transistor group to the input pad or a sum of resistances of metal wires from the NMOS transistors in each NMOS transistor group to the output pad) from each NMOS transistor group to the input pad and output pad respectively may be obtained. Therefore, resistivities of the materials of the metal wires from the NMOS transistor groups to the input pad and the output pad respectively are sequentially reduced in the power supply voltage VDD wire direction, to sequentially reduce equivalent metal wire resistances from NMOS transistor groups to the input pad and the output pad, to cancel the non-uniform turn-on of the NMOS transistor groups caused by different resistances of metal wires (equivalent metal wire resistances from the NMOS transistor groups to the input pad and the output pad) caused by different lengths of metal wires from the NMOS transistor groups to the input pad and the output pad respectively in the power supply voltage VDD wire direction, thereby improving the turn-on uniformity of the surge protection device and improving the surge protection capability.

The resistivities of the materials of the metal wires from each NMOS transistor group to the input pad and the output pad respectively are determined according to lengths of metal wires from the NMOS transistor group to the input pad and the output pad respectively and equivalent metal wire resistances from an NMOS transistor group in front of the NMOS transistor group to the input pad and the output pad, provided that the equivalent metal wire resistances from the NMOS transistor groups to the input pad and the output pad respectively are sequentially reduced in the power supply voltage VDD wire direction.

Embodiment 5

The surge protection device provided in this embodiment includes an input pad and an output pad. The input pad is connected to the power supply voltage. The output pad is connected to a ground wire. At least one NMOS transistor group formed by the same quantity of NMOS transistors is disposed between the input pad and the output pad. When there are a plurality of NMOS transistor groups, the plurality of NMOS transistor groups are arranged in parallel. In each NMOS transistor group, drains of the NMOS transistors are connected to the input pad by metal wires, sources of the NMOS transistors are connected to the output pad by metal wires, and gates of the NMOS transistors are connected to the output terminal of the drive unit 11 respectively.

When the NMOS transistor groups in the surge protection device are connected to the input pad and the output pad by metal wires having the same width, material, thickness, and quantity of layers, quantities of first connecting holes of adjacent layers of metal wires from the NMOS transistor groups to the input pad and the output pad respectively may be sequentially increased in a power supply voltage VDD wire direction, in each NMOS transistor group, among NMOS transistors that are connected to metal wires of the input pad and the output pad respectively, adjacent layers of metal wires are connected through the same quantity of first connecting holes, and the adjacent layers of metal wires of each NMOS transistor in each NMOS transistor group are connected through the same quantity of second connecting holes.

Specifically, placement positions of NMOS transistors in each NMOS transistor group are fixed, so that lengths of metal wires from each NMOS transistor group to the input pad and the output pad respectively are fixed, and the lengths of metal wires from the NMOS transistor groups to the input pad and the output pad respectively are sequentially increased in the power supply voltage VDD wire direction, in each NMOS transistor group, an equivalent resistance of the second connecting holes (a sum of equivalent resistance of the second connecting holes of the NMOS transistors in each NMOS transistor group) is equal to the equivalent turn-on resistance (which is a sum of turn-on resistances of the NMOS transistors in each NMOS transistor group), and in the metal wires of each NMOS transistor group, there is a parallel relationship (for example, resistances of a plurality of first connecting holes are parallel to each other) between resistances of the first connecting holes of adjacent layers of metal wires. Therefore, when the quantity of first connecting holes of the adjacent layers of metal wires is larger, it indicates the resistance (a sum of the parallel resistances of the plurality of first connecting holes) of the first connecting holes of the adjacent layers of metal wires is smaller, and each NMOS transistor group has the same sum of an equivalent resistance of connecting holes (which is obtained, in each NMOS transistor group, by adding a sum of the resistances of the first connecting holes of a plurality of adjacent layers of metal wires and a sum of resistances of second connecting holes of each NMOS transistor group), an equivalent turn-on resistance, and an equivalent metal wire resistance (resistances of metal wires from each NMOS transistor group to the input pad and the output pad), so that each NMOS transistor in a corresponding NMOS transistor group is more likely to be turned on, to cancel the non-uniform turn-on of the NMOS transistor groups caused by different resistances of metal wires (equivalent metal wire resistances from the NMOS transistor groups to the input pad and the output pad) caused by different lengths of metal wires from the NMOS transistor groups to the input pad and the output pad respectively in the power supply voltage VDD wire direction, thereby improving the turn-on uniformity of the surge protection device and improving the surge protection capability.

A quantity of first connecting holes of the adjacent layers of metal wires from each NMOS transistor group to the input pad and the output pad is determined according to the sum of the equivalent metal wire resistance, the equivalent turn-on resistance, and the equivalent resistance of connecting holes of each NMOS transistor group, provided that each NMOS transistor group has the same sum of the equivalent resistance of connecting holes (the first connecting holes and the second connecting holes), the equivalent turn-on resistance, and the equivalent metal wire resistance in the power supply voltage VDD wire direction.

Embodiment 6

Figure 9:
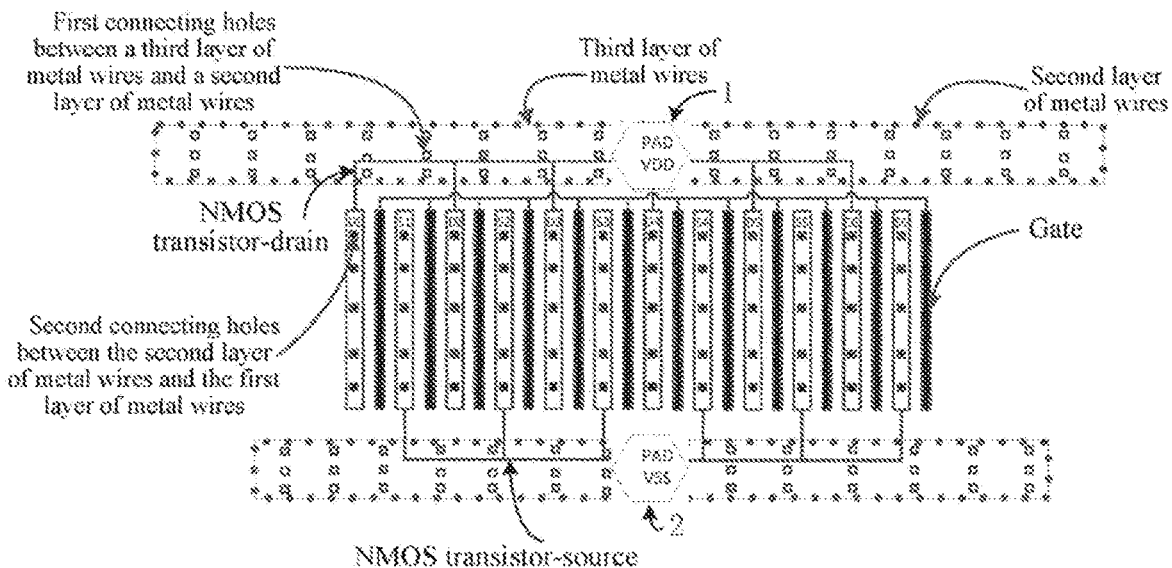
FIG. 9 is a schematic structural diagram of a surge protection device according to Embodiment 6 of the present invention.

As shown in FIG. 9, the surge protection device provided in this embodiment includes an input pad 1 and an output pad 2. The input pad 1 is connected to the power supply voltage VDD. The output pad 2 is connected to a ground wire VSS. At least one NMOS transistor group formed by the same quantity of NMOS transistors is disposed between the input pad 1 and the output pad 2. When there are a plurality of NMOS transistor groups, the plurality of NMOS transistor groups are arranged in parallel. In each NMOS transistor group, drains (for example, drains $D_1$ to $D_6$ corresponding to NMOS transistors shown in FIG. 9) of the NMOS transistors are connected to the input pad 1 by metal wires, sources (for example, sources $S_1$ to $S_6$ corresponding to the NMOS transistors shown in FIG. 9) of the NMOS transistors are connected to the output pad 2 by metal wires, and gates of the NMOS transistors are connected to the output terminal of the drive unit 11 respectively.

When the NMOS transistor groups in the surge protection device are connected to the input pad and the output pad by metal wires having the same width, material, thickness, and quantity of layers, in each NMOS transistor group, the equivalent resistance of connecting holes is equal to the equivalent turn-on resistance, and therefore the input pad 1 and the output pad 2 may be disposed in a middle position of the surge protection device, to reduce the non-uniform turn-on of the NMOS transistor groups caused by different resistances of metal wires (resistances of metal wires from the NMOS transistor groups to the input pad and the output pad) caused by different lengths of metal wires from the NMOS transistor groups to the input pad and the output pad respectively in the power supply voltage VDD wire direction, thereby improving the turn-on uniformity of the surge protection device and improving the surge protection capability. The NMOS transistor groups are connected to metal wires of the input pad and the output pad, adjacent layers of metal wires are connected through the same quantity of first connecting holes, and adjacent layers of metal wires of NMOS transistors in each NMOS transistor group are connected through the same quantity of second connecting holes.

Embodiment 7

The surge protection device provided in this embodiment includes an input pad and an output pad. The input pad is connected to the power supply voltage VDD. The output pad is connected to a ground wire VSS. At least one NMOS transistor group formed by the same quantity of NMOS transistors is disposed between the input pad and the output pad. When there are a plurality of NMOS transistor groups, the plurality of NMOS transistor groups are arranged in parallel. In each NMOS transistor group, drains of the NMOS transistors are connected to the input pad by metal wires, sources of the NMOS transistors are connected to the output pad by metal wires, and gates of the NMOS transistors are connected to the output terminal of the drive unit 11 respectively.

When the NMOS transistor groups in the surge protection device are connected to the input pad and the output pad by metal wires having the same width, material, thickness, and quantity of layers, because each NMOS transistor group has the same equivalent resistance of connecting holes, widths of NMOS transistors in the NMOS transistor groups may be sequentially reduced in a power supply voltage VDD wire direction, or lengths of NMOS transistor in the NMOS transistor groups may be sequentially increased in a power supply voltage VDD wire direction. The NMOS transistor groups are connected to metal wires of the input pad and the output pad respectively, the adjacent layers of metal wires are connected through the same quantity of first connecting holes, and the adjacent layers of metal wires of each NMOS transistor in each NMOS transistor group are connected through the same quantity of second connecting holes.

Figure 7:
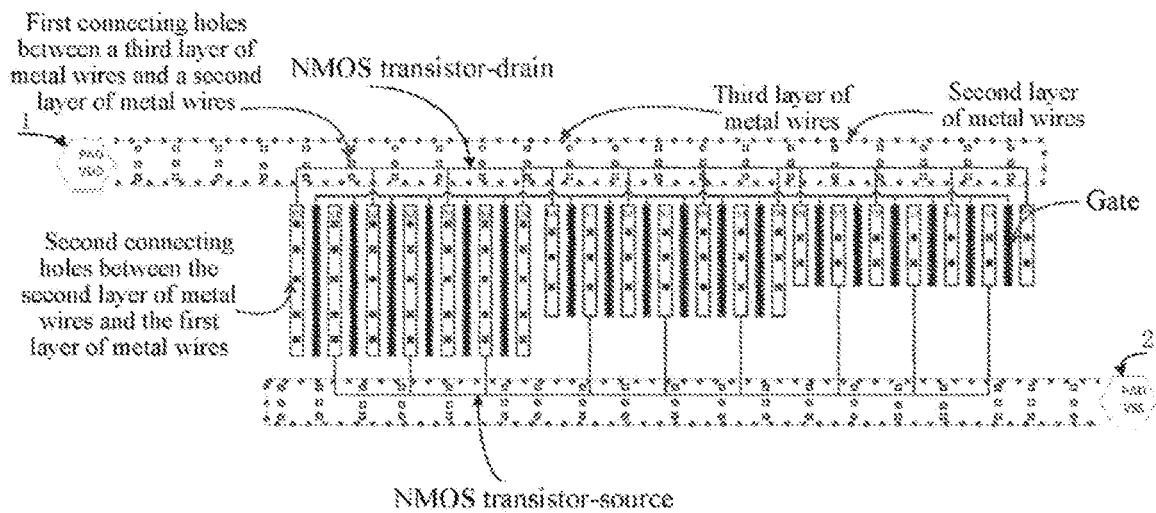
FIG. 7 is a schematic structural diagram 1 of a surge protection device according to Embodiment 7 of the present invention.

For example, as shown in FIG. 7, a first NMOS transistor group, a second NMOS transistor group, and a third NMOS transistor group are disposed between the input pad 1 and the output pad 2. Each NMOS transistor group is formed by two NMOS transistors. Widths of NMOS transistors (the widths are widths of drains and sources of the NMOS transistor groups, and widths of channels of the NMOS transistors) of the NMOS transistor groups are sequentially reduced in the power supply voltage VDD wire direction, so that a width of an NMOS transistor in the first NMOS transistor group is greater than that in the second NMOS transistor group, and a width of an NMOS transistor in the second NMOS transistor group is greater than that in the third NMOS transistor group. When a width of the NMOS transistor in each NMOS transistor group is smaller within a specific range, a threshold voltage of the NMOS transistor is smaller, so that each NMOS transistor in a corresponding NMOS transistor group is more likely to be turned on. Therefore, equivalent turn-on resistances of the NMOS transistor groups are sequentially reduced in the power supply voltage VDD wire direction, and it is implemented that each NMOS transistor group has the same sum of the equivalent turn-on resistance, the equivalent resistance of connecting holes, and the equivalent metal wire resistance. In each NMOS transistor group, the NMOS transistors have the same width.

Figure 8:
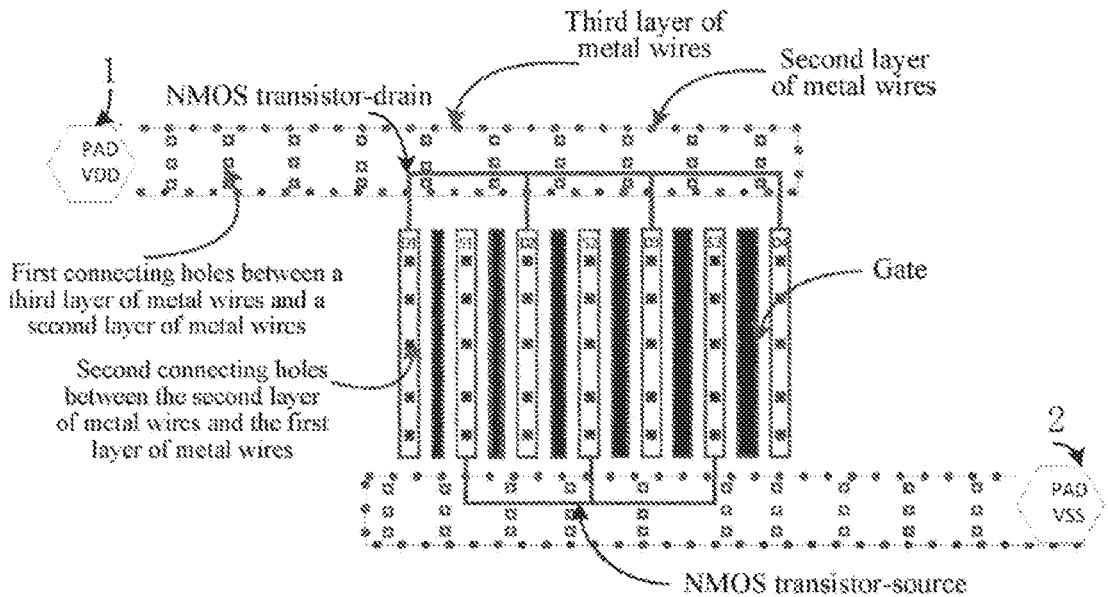
FIG. 8 is a schematic structural diagram 2 of a surge protection device according to Embodiment 7 of the present invention.

In addition, as shown in FIG. 8, a first NMOS transistor group, a second NMOS transistor group, a third NMOS transistor group, and a fourth NMOS transistor group are disposed between the input pad 1 and the output pad 2. Each NMOS transistor group is formed by one NMOS transistor. The lengths (the lengths are lengths of gates of the NMOS transistor groups, and lengths of the channels of the NMOS transistors) of NMOS transistors in the NMOS transistor groups are sequentially increased in the power supply voltage VDD wire direction, so that a length of an NMOS transistor in the first NMOS transistor group is less than that in the second NMOS transistor group, a length of an NMOS transistor in the second NMOS transistor group is less than that in the third NMOS transistor group, and a length of an NMOS transistor in the third NMOS transistor group is less than that in the fourth NMOS transistor group. When a length of an NMOS transistor in each NMOS transistor group is larger within a specific range, a voltage threshold of the NMOS transistor is smaller, so that each NMOS transistor in a corresponding NMOS transistor group is more likely to be turned on. Therefore, equivalent turn-on resistances of the NMOS transistor groups are sequentially reduced in the power supply voltage VDD wire direction, and it is implemented that each NMOS transistor group has the same sum of an equivalent turn-on resistance, an equivalent resistance of connecting holes, and an equivalent metal wire resistance. In each NMOS transistor group, the NMOS transistors have the same length.

Specifically, placement positions of NMOS transistors in each NMOS transistor group are fixed, so that lengths of metal wires from each NMOS transistor group to the input pad and the output pad respectively are fixed, and the lengths of metal wires from the NMOS transistor groups to the input pad and the output pad respectively are sequentially increased in the power supply voltage VDD wire direction Therefore, widths of NMOS transistors in the NMOS transistor groups are sequentially reduced in the power supply voltage VDD wire direction, or lengths of NMOS transistor in the NMOS transistor groups are sequentially increased in the power supply voltage VDD wire direction, so that each NMOS transistor group has the same sum of an equivalent turn-on resistance, an equivalent resistance of connecting holes, and an equivalent metal wire resistance, to cancel the non-uniform turn-on of the NMOS transistor groups caused by different resistances of metal wires (resistances of metal wires from the NMOS transistor groups to the input pad and the output pad) caused by different lengths of metal wires from the NMOS transistor groups to the input pad and the output pad respectively in the power supply voltage VDD wire direction, thereby improving the turn-on uniformity of the surge protection device and improving the surge protection capability.

The widths and lengths of NMOS transistors in the NMOS transistor groups may be determined according to a threshold voltage of the NMOS transistors and roll-off curves of the widths and the lengths of the NMOS transistors in the used process, and a sum of an equivalent metal wire resistance, an equivalent turn-on resistance, and an equivalent resistance of connecting holes of an NMOS transistor group, provided that each NMOS transistor group has the same sum of an equivalent turn-on resistance, an equivalent resistance of connecting holes, and an equivalent metal wire resistance in the power supply voltage VDD wire direction. In addition, the widths of NMOS transistors in the NMOS transistor groups are reduced.

The delay unit 10 may be placed on a vacated area to further reduce costs.

Embodiment 8

Figure 6:
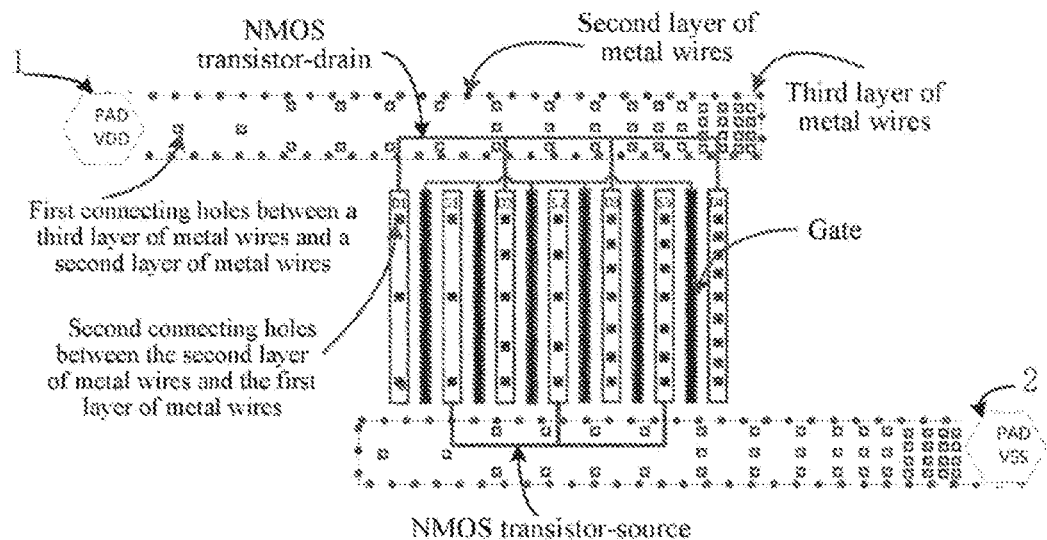
FIG. 6 is a schematic structural diagram of a surge protection device according to Embodiment 8 of the present invention.

As shown in FIG. 6, the surge protection device provided in this embodiment includes an input pad 1 and an output pad 2. The input pad 1 is connected to the power supply voltage VDD. The output pad 2 is connected to a ground wire VSS. At least one NMOS transistor group formed by the same quantity of NMOS transistors is disposed between the input pad 1 and the output pad 2. When there are a plurality of NMOS transistor groups, the plurality of NMOS transistor groups are arranged in parallel. In each NMOS transistor group, drains (for example, drains. $D_1$ to $D_4$ corresponding to NMOS transistors shown in FIG. 6) of the NMOS transistors are connected to the input pad 1 by metal wires, sources (for example, sources $S_1$ to $S_4$ corresponding to the NMOS transistors shown in FIG. 3) of the NMOS transistors are connected to the output pad 2 by metal wires, and gates of the NMOS transistors are connected to the output terminal of the drive unit 11 respectively.

When the NMOS transistor groups in the surge protection device are connected to the input pad and the output pad by metal wires having the same width, material, thickness, and quantity of layers, quantities of second connecting holes of adjacent layers of metal wires of NMOS transistors in the NMOS transistor groups may be sequentially increased in a power supply voltage VDD wire direction, and each NMOS transistor group is connected to metal wires of the input pad and the output pad respectively, the adjacent layers of metal wires are connected through the same quantity of first connecting holes, and the adjacent layers of metal wires of each NMOS transistor in each NMOS transistor group have the same quantity of second connecting holes.

Specifically, placement positions of NMOS transistors in each NMOS transistor group are fixed, so that lengths of metal wires from each NMOS transistor group to the input pad and the output pad respectively are fixed, and the lengths of metal wires from the NMOS transistor groups to the input pad and the output pad respectively are sequentially increased in the power supply voltage VDD wire direction, in each NMOS transistor group, an equivalent resistance of the first connecting holes is equal to the equivalent turn-on resistance, and there is a parallel relationship (for example, resistances of a plurality of second connecting holes are parallel to each other) between resistances of the second connecting holes of adjacent layers of metal wires of the NMOS transistors in each NMOS transistor group. Therefore, when a quantity of second connecting holes of the adjacent layers of metal wires is larger, a resistance (a sum of the parallel resistances of the plurality of second connecting holes) of the second connecting holes of the adjacent layers of metal wires is lower, and each NMOS transistor group has the same sum of an equivalent resistance of connecting holes (which is obtained, in each NMOS transistor group, by adding a sum of the resistances of the first connecting holes of a plurality of adjacent layers of metal wires and a sum of resistances of second connecting holes of each NMOS transistor group), an equivalent turn-on resistance, and an equivalent metal wire resistance (resistances of metal wires from each NMOS transistor group to the input pad and the output pad), to cancel the non-uniform turn-on of the NMOS transistor groups caused by different resistances of metal wires (equivalent metal wire resistances from the NMOS transistor groups to the input pad and the output pad) caused by different lengths of metal wires from the NMOS transistor groups to the input pad and the output pad respectively in the power supply voltage VDD wire direction, thereby improving the turn-on uniformity of the surge protection device and improving the surge protection capability.

A quantity of second connecting holes of the adjacent layers of metal wires of the NMOS transistors in each NMOS transistor group is determined according to the sum of the equivalent metal wire resistance, the equivalent turn-on resistance, and the equivalent resistance of connecting holes of each NMOS transistor group, provided that each NMOS transistor group has the same sum of the equivalent resistance of connecting holes (the first connecting holes and the second connecting holes), the equivalent turn-on resistance, and the equivalent metal wire resistance in the power supply voltage VDD wire direction.

Figure 10:
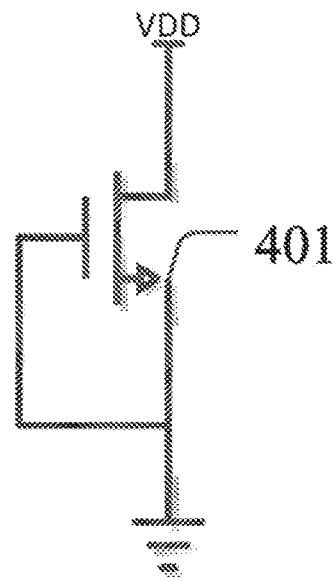
FIG. 10 is a schematic structural diagram of a GGNMOS protection circuit formed by a surge protection device according to the present invention.

It should be noted that the gates of the NMOS transistors in the surge protection device provided in the present invention may be connected to the output pad respectively to form a GGNMOS protection circuit. For example, a surge protection device is formed by one NMOS transistor group. As shown in FIG. 10, in a GGNMOS protection circuit formed by the surge protection device, a source and a gate of an NMOS transistor 401 are grounded respectively (an output pad connected to a ground wire), and a drain of the NMOS transistor 401 is connected to a power supply voltage VDD (an input pad connected to the power supply voltage).

Figure 11:
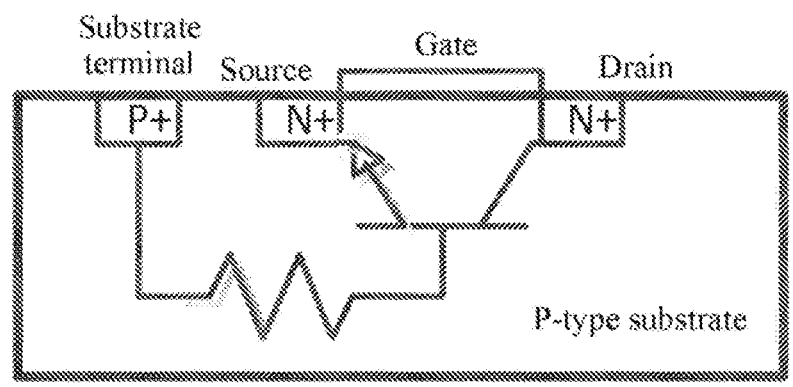
FIG. 11 is a diagram of a turn-on principle of the GGNMOS protection circuit formed by a surge protection device according to the present invention.

As shown in FIG. 11, when a surge phenomenon occurs, a parasitic NPN bipolar junction transistor formed by the NMOS transistor 401 is turned on. When a large amount of positive charge accumulates on a drain, the positive charge is converted to a P-type substrate of the NMOS transistor 401 through a reverse-biased PN junction between a drain terminal and the P-type substrate of the NMOS transistor, and the part of positive charge enables the PN junction of the source terminal of the NMOS transistor 401 to be turned on, thereby turning on the parasitic NPN bipolar junction transistor.

To improve the turn-on uniformity of the surge protection device in the GGNMOS protection circuit and improve the surge protection capability, the surge protection devices provided in Embodiments 1 to 6 and 8 may be used. Details are not described herein again. The surge protection device in Embodiment 7 in which the lengths of the NMOS transistors in each NMOS transistor group are sequentially increased in the power supply voltage VDD wire direction may also be used. Specifically, the lengths of NMOS transistor in the NMOS transistor groups are sequentially increased in the power supply voltage VDD wire direction, so that a base religion of the parasitic NPN bipolar junction transistor formed by the NMOS transistors in the NMOS transistor groups is wider, a current passing through the base region of the parasitic NPN bipolar junction transistor is larger, and the base of the parasitic NPN bipolar junction transistor is more likely to be turned on, to cancel the non-uniform turn-on of the NMOS transistor groups caused by different resistances of metal wires (resistances of metal wires from the NMOS transistor groups to the input pad and the output pad) caused by different lengths of metal wires from the NMOS transistor groups to the input pad and the output pad respectively in the power supply voltage VDD wire direction, thereby improving the turn-on uniformity of the surge protection device and improving the surge protection capability.

In addition, the structure of the surge protection device provided in the present invention may further be a combination of any one of the surge protection devices provided in Embodiment 1 to 6 and the surge protection device provided in Embodiment 7 or 8, thereby ensuring that each NMOS transistor group in the surge protection device has the same sum of an equivalent resistance of connecting holes (the first connecting holes and the second connecting holes), an equivalent turn-on resistance, and an equivalent metal wire resistance in the power supply voltage VDD wire direction. Details are not described herein again.

A surge protection device provided in the present invention includes an input pad and an output pad. The input pad is connected to a power supply voltage. The output pad is connected to a ground wire. NMOS transistor groups are disposed between the input pad and the output pad. The NMOS transistor groups are connected to the input pad and the output pad respectively by metal wires. According to a preset condition, the structures of the metal wires between the NMOS transistor groups and the input pad and the output pad respectively and/or the structures of the NMOS transistor groups are changed to reduce or cancel non-uniform turn-on of the NMOS transistor groups caused by different lengths of metal wires from the NMOS transistor groups to the input pad and the output pad respectively in a power supply voltage wire direction, thereby improving the turn-on uniformity of the surge protection device and improving the surge protection capability.

The surge protection device provided in the present invention may be used in an analog integrated circuit chip A specific structure of the surge protection device in the analog integrated circuit chip is not described herein again.

In addition, the foregoing surge protection device may be alternatively used as an important part of an analog circuit in the communication terminal. The communication terminal herein is a computer device that can be used in a mobile environment and supports a plurality of communication standards such as GSM, EDGE, TD-SCDMA, TDD-LTE, FDD-LTE. The computer device includes a mobile phone, a notebook computer, a tablet computer, an on-board computer, and the like. In addition, the technical solution provided in the present invention is also applicable to application scenarios of other analog circuits, for example, a communication base station.

The surge protection device, the chip formed thereby, and the communication terminal provided in the present invention are described above in detail. Any obvious modification made by a person of ordinary skill in the art falls within the protection scope of the patent of the present invention without departing from the essence of the present invention.

What is claimed is:

1. A surge protection device, comprising an input pad and an output pad, wherein the input pad is connected to a power supply voltage, the output pad is connected to a ground wire, NMOS transistor groups are disposed between the input pad and the output pad, the NMOS transistor groups are connected to the input pad and the output pad respectively by metal wires, and
structures of the metal wires between the NMOS transistor groups and the input pad and the output pad are changed respectively to reduce or cancel non-uniform turn-on of the NMOS transistor groups caused by different lengths of metal wires from the NMOS transistor groups to the input pad and the output pad respectively in a power supply voltage wire direction, wherein
when the NMOS transistor groups are respectively connected to the input pad and the output pad by metal wires having a same width, material, and thickness, quantities of layers of the metal wires from the NMOS transistor groups to the input pad and the output pad are sequentially increased in the power supply voltage wire direction, to sequentially reduce equivalent metal wire resistances from the NMOS transistor groups to the input pad and the output pad respectively.

2. A surge protection device, comprising an input pad and an output pad, wherein the input pad is connected to a power supply voltage, the output pad is connected to a ground wire, NMOS transistor groups are disposed between the input pad and the output pad, the NMOS transistor groups are connected to the input pad and the output pad respectively by metal wires, and
structures of the metal wires between the NMOS transistor groups and the input pad and the output pad are changed respectively to reduce or cancel non-uniform turn-on of the NMOS transistor groups caused by different lengths of metal wires from the NMOS transistor groups to the input pad and the output pad respectively in a power supply voltage wire direction, wherein
when the NMOS transistor groups are respectively connected to the input pad and the output pad by metal wires having a same quantity of layers, thickness, and material, widths of the metal wires from the NMOS transistor groups to the input pad and the output pad respectively are sequentially increased in the power supply voltage wire direction, to sequentially reduce equivalent metal wire resistances from the NMOS transistor groups to the input pad and the output pad.

3. A surge protection device, comprising an input pad and an output pad, wherein the input pad is connected to a power supply voltage, the output pad is connected to a ground wire, NMOS transistor groups are disposed between the input pad and the output pad, the NMOS transistor groups are connected to the input pad and the output pad respectively by metal wires, and
structures of the metal wires between the NMOS transistor groups and the input pad and the output pad are changed respectively to reduce or cancel non-uniform turn-on of the NMOS transistor groups caused by different lengths of metal wires from the NMOS transistor groups to the input pad and the output pad respectively in a power supply voltage wire direction, wherein
when the NMOS transistor groups are respectively connected to the input pad and the output pad by metal wires having a same width, material, and quantity of layers, thicknesses of the metal wires from the NMOS transistor groups to the input pad and the output pad respectively are sequentially increased in the power supply voltage wire direction, to sequentially reduce equivalent metal wire resistances from the NMOS transistor groups to the input pad and the output pad respectively.

4. A surge protection device, comprising an input pad and an output pad, wherein the input pad is connected to a power supply voltage, the output pad is connected to a ground wire, NMOS transistor groups are disposed between the input pad and the output pad, the NMOS transistor groups are connected to the input pad and the output pad respectively by metal wires, and
structures of the metal wires between the NMOS transistor groups and the input pad and the output pad are changed respectively to reduce or cancel non-uniform turn-on of the NMOS transistor groups caused by different lengths of metal wires from the NMOS transistor groups to the input pad and the output pad respectively in a power supply voltage wire direction, wherein
when the NMOS transistor groups are respectively connected to the input pad and the output pad by metal wires having a same width, thickness, and quantity of layers, resistivities of materials of the metal wires from the NMOS transistor groups to the input pad and the output pad respectively are sequentially reduced in the power supply voltage wire direction, to sequentially reduce equivalent metal wire resistances from the NMOS transistor groups to the input pad and the output pad respectively.

5. A surge protection device, comprising an input pad and an output pad, wherein the input pad is connected to a power supply voltage, the output pad is connected to a ground wire, NMOS transistor groups are disposed between the input pad and the output pad, the NMOS transistor groups are connected to the input pad and the output pad respectively by metal wires, and
structures of the NMOS transistor groups are changed to cancel non-uniform turn-on of the NMOS transistor groups caused by different lengths of metal wires from the NMOS transistor groups to the input pad and the output pad respectively in a power supply voltage wire direction, wherein
when the NMOS transistor groups are respectively connected to the input pad and the output pad by metal wires having a same width, material, thickness, and quantity of layers, widths of NMOS transistors in the NMOS transistor groups are sequentially reduced in the power supply voltage wire direction, so that each NMOS transistor group has a same sum of an equivalent turn-on resistance, an equivalent resistance of connecting holes, and an equivalent metal wire resistance.

6. The surge protection device according to claim 5, wherein
the NMOS transistor groups are connected to metal wires of the input pad and the output pad respectively, adjacent layers of metal wires are connected through a same quantity of first connecting holes, and adjacent layers of metal wires of the NMOS transistors in each NMOS transistor group are connected through a same quantity of second connecting holes.

7. A surge protection device, comprising an input pad and an output pad, wherein the input pad is connected to a power supply voltage, the output pad is connected to a ground wire, NMOS transistor groups are disposed between the input pad and the output pad, the NMOS transistor groups are connected to the input pad and the output pad respectively by metal wires, and structures of the NMOS transistor groups are changed to cancel non-uniform turn-on of the NMOS transistor groups caused by different lengths of metal wires from the NMOS transistor groups to the input pad and the output pad respectively in a power supply voltage wire direction, wherein when the NMOS transistor groups are respectively connected to the input pad and the output pad by metal wires having a same width, material, thickness, and quantity of layers, lengths of NMOS transistor in the NMOS transistor groups are sequentially increased in the power supply voltage wire direction, so that each NMOS transistor group has a same sum of an equivalent turn-on resistance, an equivalent resistance of connecting holes, and an equivalent metal wire resistance.

8. A surge protection device, comprising an input pad and an output pad, wherein the input pad is connected to a power supply voltage, the output pad is connected to a ground wire, NMOS transistor groups are disposed between the input pad and the output pad, the NMOS transistor groups are connected to the input pad and the output pad respectively by metal wires, and structures of the NMOS transistor groups are changed to cancel non-uniform turn-on of the NMOS transistor groups caused by different lengths of metal wires from the NMOS transistor groups to the input pad and the output pad respectively in a power supply voltage wire direction, wherein when the NMOS transistor groups are respectively connected to the input pad and the output pad by metal wires having a same width, material, thickness, and quantity of layers, quantities of connecting holes of adjacent layers of metal wires of NMOS transistors in each NMOS transistor group are sequentially increased in the power supply voltage wire direction, so that each NMOS transistor group has a same sum of an equivalent resistance of the connecting holes, an equivalent turn-on resistance, and an equivalent metal wire resistance.

9. The surge protection device according to claim 8, wherein the NMOS transistor groups are connected to metal wires of the input pad and the output pad respectively, adjacent layers of metal wires are connected through a same quantity of first connecting holes, and in each NMOS transistor group, adjacent layers of metal wires of each NMOS transistor has a same quantity of second connecting holes.

\* \* \* \* \*